United States Patent [19]
Miska et al.

[11] Patent Number: 5,712,449
[45] Date of Patent: *Jan. 27, 1998

[54] WIDE AREA EMI GASKET WITH CONDUCTORS TRAVERSING CORE

[75] Inventors: Stanley R. Miska, Pittsford; Daniel T. Courtney, Palmyra; Kenneth W. Hermann, Rochester, all of N.Y.

[73] Assignee: Schlegel Corporation, Rochester, N.Y.

[*] Notice: The term of this patent shall not extend beyond the expiration date of Pat. No. 5,646,369.

[21] Appl. No.: 448,672

[22] Filed: May 24, 1995

[51] Int. Cl.$^6$ .................................................. H05K 9/00
[52] U.S. Cl. ........................ 174/35 GC; 428/36.1; 174/35 R; 174/35 MS
[58] Field of Search ............... 174/35 R, 35 MS File, 174/35 GC; 139/425 R, 426 R; 428/361.365; 66/202

[56] References Cited

U.S. PATENT DOCUMENTS

| | | | |
|---|---|---|---|
| 3,140,342 | 7/1964 | Ehrreich et al. | 174/35 GC |
| 3,505,463 | 4/1970 | McAdams | 174/35 GC |
| 4,310,946 | 1/1982 | Baker et al. | 15/363 |
| 4,857,668 | 8/1989 | Buonanno | 174/35 GC |
| 5,045,635 | 9/1991 | Kaplo et al. | 174/35 GC |
| 5,202,536 | 4/1993 | Buonanno | 174/35 GC |
| 5,569,877 | 10/1996 | Yumi | 174/35 GC |

*Primary Examiner*—Bot L. Ledynh
*Attorney, Agent, or Firm*—Eckert Seamans Cherin & Mellott

[57] ABSTRACT

An EMI gasket blocks electromagnetic radiation between electrically conductive bodies, is disposed to occupy an area, and can have openings for conductors or connectors. A resilient core is covered on opposite surfaces with a conductive sheet material such as a metalized polymer fabric that can be woven, nonwoven, knitted, braided, etc., for providing electromagnetic sealing when the gasket is compressed between the bodies. The polymer sheet is coupled through between the opposite faces of the gasket along lengthwise seams that are heat sealed through the core or have conductive thread, yarn, wire or fasteners that extend through the core. Preferably, the gasket is quilted using conductive thread or yarn. The conductive material extending through the core to couple the opposite faces of the gasket provides conducting paths that improve shielding efficiency as compared to a comparable structure wherein electrical conduction between the opposite faces (and the sealed bodies) is limited to the conductive surface material. The seal can be die cut to form openings for connectors or conductors, avoiding the need for perimeter seals around the openings.

16 Claims, 4 Drawing Sheets

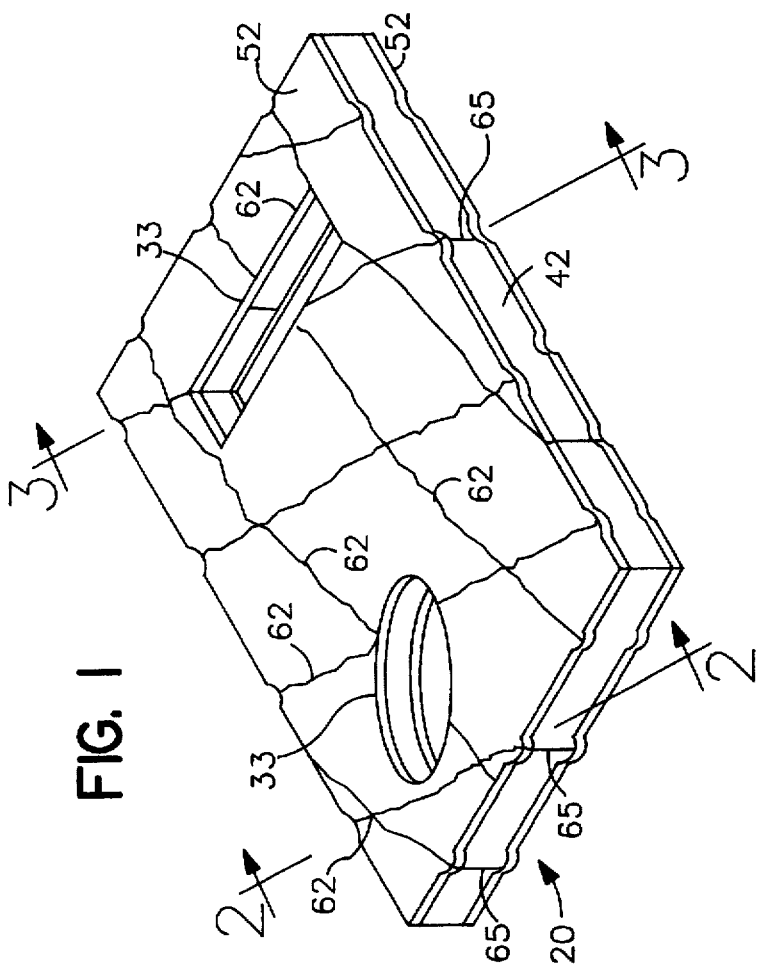
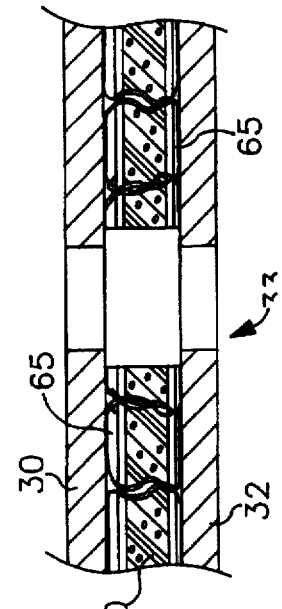
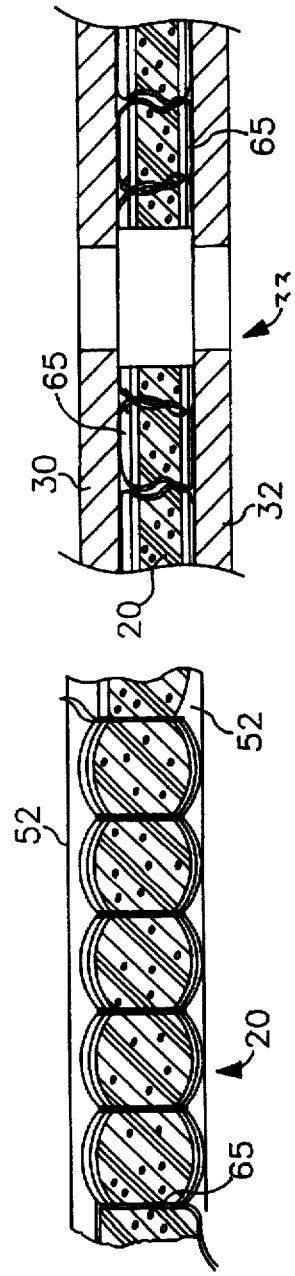
FIG. 1
FIG. 3
FIG. 2

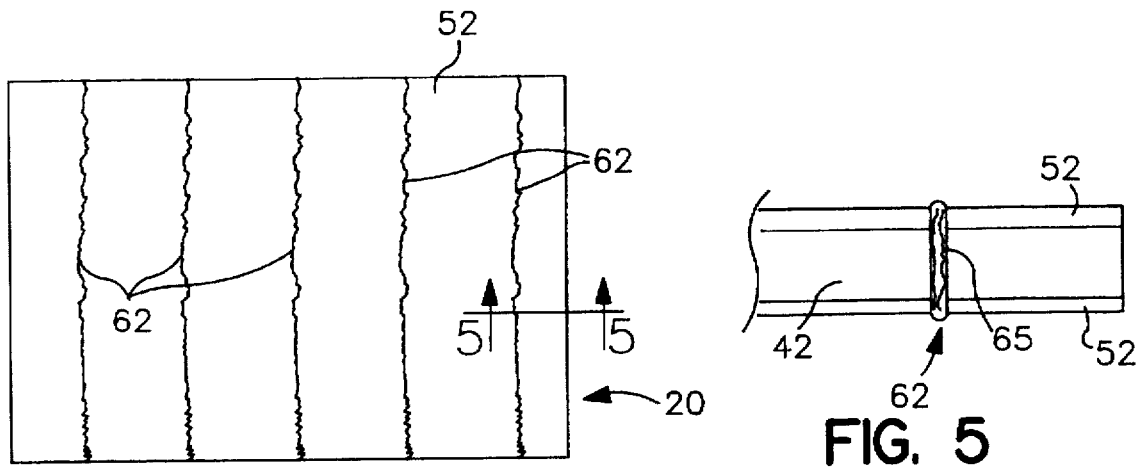
FIG. 4
FIG. 5
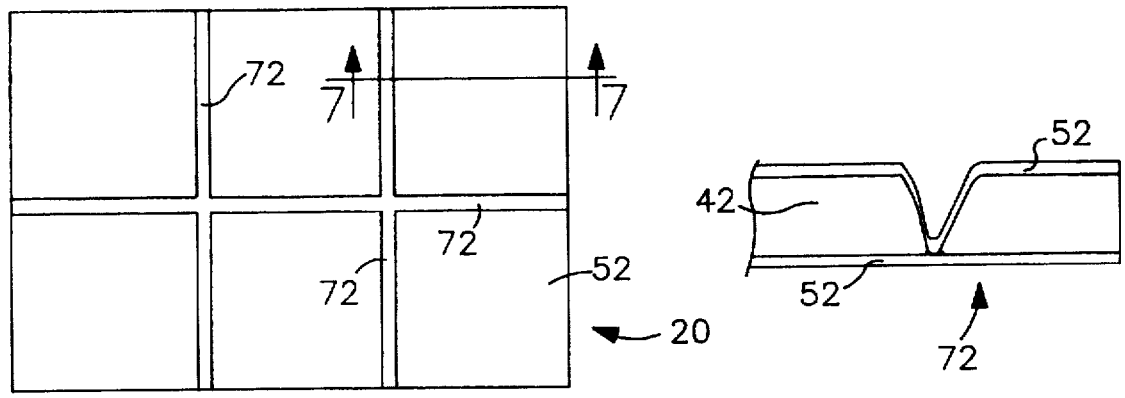
FIG. 6
FIG. 7
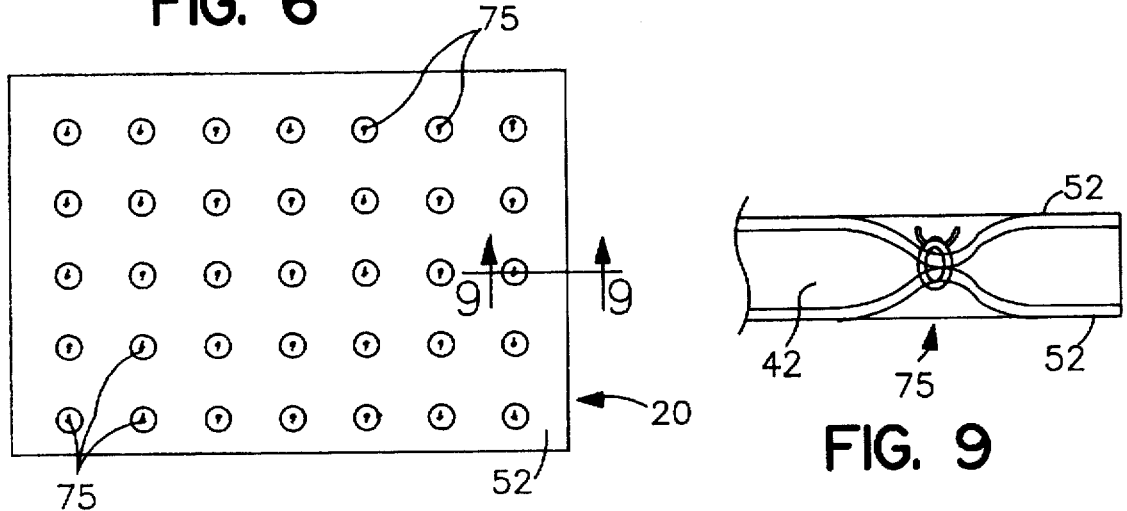
FIG. 8
FIG. 9

WIDE AREA EMI GASKET WITH CONDUCTORS TRAVERSING CORE

BACKGROUND OF THE INVENTION

1. Field of the Invention

The invention relates to electromagnetic shielding using electrically conductive gaskets to bridge across openings between conductive structures such as subassembly housings, circuit card flanges, external housings and the like. The gasket is generally structured to include a resilient sheet-like compressible core of low electrical conductivity, having on its surfaces a conductive sheet material such as a metalized fabric with a high conductivity. Conductive connections are made between points on the conductive sheets on opposite sides, through the core, using conductive yarn or the like.

2. Prior Art

A gasket having a conductive surface material on a nonconductive core provides electrically conductive paths through the surface material, from any given point on the surface material to any other point on portions of the surface material that are contiguous with the portion having the given point. The object of the conductive gasket is to electrically couple from one side or face of the gasket to the other. Assuming the core is fully wrapped with conductive material (e.g., in one contiguous sheet or two spaced sheets bridged at the edges by conductive tape), the conductive paths extend around a peripheral edge of the gasket.

It is advantageous that the gasket be trimmed to size, which would remove the conductive material at one or more edges. Thus, in a wide gasket the electrical path between a given point on one side and a given point on the other side can be a long path, extending across one side, around the edge and across the other side. Removal of any conductive surface material at the edges reduces the shielding efficiency of the gasket by increasing the electrical resistance from point to point on opposite sides. If all the edges are trimmed to remove the conductive material, the gasket is ineffective for shielding against propagation of electromagnetic interference (EMI).

According to the present invention, additional conductive paths are provided through the resilient core by spaced connections made at points or seam lines, to provide more and better electrical connections between points on opposite sides, and thus to improve shielding effectiveness, even as compared to a fully wrapped gasket. The conductive paths can be formed in several ways, preferably including forming conductive seams through the core material to join the conductive sheet electrically on opposite sides or faces, through the core. A plurality of seams can be formed to quilt the gasket, by heat sealing the opposite sides together through the core, or by sewing through the gasket using conductive yarn or wire, staples, pins or the like. This conductive gasket is particularly useful for shielding relatively large areas such as bypass panels at which input/output lines traverse the boundary of a shielded enclosure, and permits die cutting of holes, edge trimming and even omission of any edge connections, with improved shielding efficiency.

To reduce problems due to alternating electromagnetic fields emanating from electronic equipment and/or due to the tendency for incident electromagnetic fields to affect sensitive circuits, a conductive barrier or shield is placed along the path of field propagation. The shield provides an electrical discontinuity. The conductive barrier typically is coupled electrically to a circuit ground. Part of the electromagnetic energy incident on the shield is reflected, and part of the energy induces currents in the shield. These currents are dissipated resistively in the conductive material of the shield. Thus the field is attenuated.

Conventional shielding typically uses the external housing of an article of electronic equipment for at least part of the shield barrier. In addition, internal shield barriers, enclosures, ground planes and the like can be provided for particular circuit elements within the enclosure. For these purposes, sheet metal materials, laminates of metal and plastic and/or conductive coatings typically form the conductive electromagnetic shield barrier.

Many modern electronic devices emit or are sensitive to electromagnetic interference or "EMI" at high frequencies. For example, computer clock and digital data signals, phase locked loops, switched mode power supplies, various radio frequency and microwave devices and the like are sources of EMI. Many such electronic circuits also are susceptible to EMI, and must be shielded in order to operate properly.

The effectiveness of a shield is a function of a number of factors including the electrical properties of the shield material (e.g., conductivity and magnetic permeability), the thickness and continuous or discontinuous nature of the shield, the frequency of the EMI, the spacing and configurations of the EMI source and the shield, etc. For shielding relatively higher frequencies, gaps in the conductive material must be smaller to prevent leakage as compared to shielding lower frequencies.

The frequencies to be attenuated include harmonics. For a computer, for example having a basic clock frequency of 25 to 150 MHz, significant harmonics may be present up to 1 GHz or more. Effective shielding requires a nearly continuous (i.e., gapless) shield, preferably arranged close to the source of EMI and/or close to the susceptible circuit, and made of a highly conductive material.

Typically, shielding is provided by a conductive enclosure made of thin sheet metal, metallized plastic or the like. An external housing can form a conductive shielding enclosure, and shielding subenclosures can be provided for subassemblies within the housing. Effective shielding advantageously includes conductive EMI blocking seals and gaskets that continue the conductive barrier of a shield across any gaps or seams between conductive panels, enclosures, doors, housing elements and the like, which form portions of the shield. Where conductive elements such as these are simply attached without a gasket, minor dimensional variations leave gaps that allow propagation of high frequency EMI fields.

Resiliently compressible conductive seals are disclosed, for example, in U.S. Pat. Nos. 4,857,668—Buonanno; 5,045,635—Kaplo et al.; and 5,202,536—Buonanno, which are hereby incorporated. According to these patents, a conductive sheet material such as a woven or nonwoven metalized plastic fabric, or perhaps a braid, knit or wrap of conductive threads or the like, is provided on a resilient compressible core of indefinite length to form a thin elongated linear seal that can be placed between conductive panels to bridge a gap between them, e.g., due to discontinuities and the like. One possible conductive material is Monsanto "Flectron" nickel/copper metallized polyester fabric.

A conductive seal as described can be formed in various cross sectional shapes, including round, rectangular and irregular shapes, and can be provided with an attachment means such as a clip or an adhesive area, to assist in mounting. Conductive gaskets can be made to the specific shape and area needed to reside between the conductive surfaces between which they are to seal, but it is generally more difficult and expensive to provide customized shapes and sizes.

Conductive gaskets encompassing large sealing areas are more difficult to make and/or require additional attention as compared to elongated small area seals. Relatively slender linearly elongated conductive seals are generally mounted so as to define lines electrically connecting between conductive panels. Where an opening is to be provided, the linear seals are arranged around the perimeter of the opening.

For an EMI seal comprising a conductive sheet material on a resilient core, the core can be molded, extruded, cut from a block of resilient stock, etc. The conductive sheet can be wrapped on the core and affixed, for example, by adhesive. According to the above Buonanno patents, the core also can comprise a polymer with a foaming agent, applied as a liquid to a woven or non-woven metallized fabric that is wrapped, for example into a closed or substantially closed shape. The polymer expands to fill the void and as the polymer cures, it engages securely with the fabric.

Providing and wrapping a resilient core can be accomplished readily for substantially elongated linear gaskets in round, oval, rectangular or complex cross sectional shapes that cover a small surface area. Where the surface area between facing conductive structures is large, a wide area gasket having a thickness sufficient to accommodate any variations in the width of the gap, can be placed between facing conductive structures. Cutout openings allow passage of conductors or connectors, with the gasket sealing between the conductive structures around the opening(s). This may be more convenient than attempting to mount slender linear gaskets around openings to seal conductively between the facing structures, especially with a complex arrangement of openings over a wide area. However, the electrical resistance between points on opposite faces of the gasket is increased by the removal of conductive material.

Assuming that the compressible core of a wide area gasket is not conductive, then the shortest conductive path from any point on one side of the gasket to any point on the opposite side must pass clear across the surfaces on opposite sides of the gasket to the edge, and around any holes through the gasket. Therefore, wide gaskets may be characterized by a relatively higher point-to-point resistance and reduced EMI shielding efficiency as compared to a corresponding amount of conductive material embodied as a plurality of individual elongated seals. On the other hand, individual seals are more complicated to mount.

What is needed is an improved means for sealing wide areas against EMI, that is versatile as to the pattern of openings and cutouts, if any, and provides a high shielding effectiveness.

According to the present invention, a large area EMI sealing gasket is provided in the form of two conductive sheets on opposite faces of a compressible core sheet having a width sufficient to accommodate variations in a gap between structures to be sealed against propagation of EMI. The core can be an integral sheet or formed from adjacent segments. The gasket can be die cut to size, including removal of the conductive surface material along edges of the gasket and to provide clearance openings.

In order to provide conductive paths between the opposite faces of the gasket, conductive material is arranged to extend through the compressible core, for example at regularly spaced intervals. The conductive material can be portions of the conductive sheet, pressed into the core with heat such that the sheets on opposite sides are heat sealed to electrically couple the metallic portions of the two sheets. This can be accomplished in point fashion or by elongated seams. Alternatively, the conductive sheets can be joined through the compressible core using conductive fibers or yarns, wires, staples and/or pin structures. The conductive structures bridging between the conductive sheets provide shorter electrical paths between any point on one side of the gasket and any point on the other, generally improving the efficiency of the gasket for blocking EMI.

SUMMARY OF THE INVENTION

It is an object of the invention to provide a relatively wide area EMI shielding seal or gasket that has a high shielding efficiency and is easy and inexpensive to manufacture and use.

It is also an object of the invention to provide a sheet-like gasket that is readily cut to form openings providing clearance for connectors, circuit card end plates and the like.

It is another object to apply easily manufactured elongated seal structures to sealing over a wide area that may have a complex configuration, without requiring attention to placing the elongated seal structures along edges to be sealed.

It is also an object to provide a versatile seal arrangement that can accommodate irregular shapes and surfaces as well as sealing arrangements where conductive material is to be placed in specific areas and not others.

It is another object of the invention to facilitate manufacture of a wide area gasket using efficient means for conductively joining opposite sides of the gasket along seams providing distributed electrical connections through the gasket, optionally including additional connections at cut edges.

These and other objects are accomplished by a wide area EMI gasket that has conductors traversing the compressible core of the gasket between layers of conductive surface material. The gasket is dimensioned to occupy an area between conductive bodies and is thick enough to accommodate surface variations when compressed. The gasket can have openings for conductors or connectors to pass through the shielding barrier, with the gasket sealing around the openings.

A resilient core is covered on opposite surfaces with a conductive sheet material such as a metalized polymer fabric that can be woven, nonwoven, knitted, braided, wrapped, etc., for providing electromagnetic sealing when the gasket is compressed between the bodies. The polymer sheet is coupled through between the opposite faces of the gasket along lengthwise seams that are heat sealed through the core or have conductive thread, yarn, wire or fasteners that extend through the core. Preferably, the gasket is quilted using conductive thread or yarn.

The conductive material extending through the core to couple the opposite faces of the gasket provides conducting paths that improve shielding efficiency as compared to a comparable structure wherein electrical conduction between the opposite faces (and the sealed bodies) is limited to the conductive surface material. The seal can be die cut to form openings for connectors or conductors, avoiding the need for perimeter seals around the openings.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings, FIG. 1 is a perspective view illustrating a wide area EMI gasket according to a first embodiment of the invention, with conductive means passing through a resilient core.

FIG. 2 is a section view taken along lines 2—2 in FIG. 1.

FIG. 3 is a section view through a gasket according to FIG. 1, shown compressed between conductive bodies at an opening, for example along line 3—3 in FIG. 1.

FIG. 4 is a plan view showing an alternative embodiment with parallel stitch lines.

FIG. 5 is a partial section view through a stitch line, for example along line 5—5 in FIG. 4.

FIG. 6 is a plan view showing an alternative embodiment with depressions through the core dividing the core into segments.

FIG. 7 is a partial section view along a depression, for example along line 7—7 in FIG. 5.

FIG. 8 is a plan view showing an alternative embodiment with discrete attachment points.

FIG. 9 is a partial section view through an embodiment wherein discrete attachment points are formed by tufts.

FIG. 12 is a plan view illustrating an alternative embodiment wherein the invention is applied to a computer backplane gasket or the like.

DETAILED DESCRIPTION OF THE PREFERRED EMBODIMENTS

Figure 10:
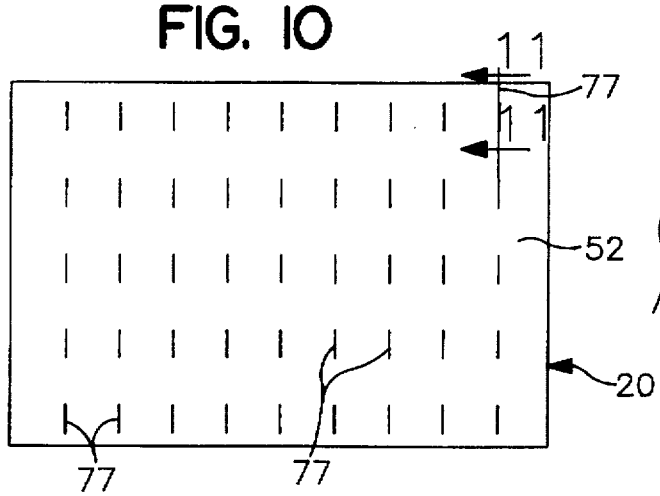
FIG. 10 is a plan view of another alternative, with discrete attachments made using staples.

FIGS. 1–3 show an exemplary embodiment of a wide area EMI sealing gasket 20, for blocking electromagnetic radiation between at least two electrically conductive bodies 30, 32 over an area having a length and a width. In FIGS. 1 and 2, the gasket is uncompressed, and in FIG. 3 the gasket is shown compressed between the conductive bodies 30, 32.

Gasket 20 has a compressible core 42 generally shaped as a sheet extending along the length and width of the gasket, and an electrically conductive surface material 52 disposed on both opposite faces of the core for bearing against the conductive bodies to achieve electrical contact. A plurality of electrically conductive connections at spaced positions, electrically couple between the electrically conductive surfaces on said opposite faces.

Gasket 20 is useful for a wide range of EMI sealing applications and can be sandwiched between various forms of conductive panels and the like. The gasket is particularly useful to make electrical connections between conductive bodies 30, 32 around clearance openings 33, as shown in FIGS. 1 and 3. Sealed clearance openings may be appropriate to seal gaps around conductors or connectors, such as between a conductive housing and a circuit card having a grounded metal flange with a connector protruding for access. This avoids the need to mount linear seals around the periphery.

Gasket 20 need only be sufficiently thick to encompass the expected variations in the width of the gap between the sealed conductive bodies 30, 32 when compressed between them. The core 42 is sufficiently resilient to conform closely to both conductive bodies. Although in the embodiment of FIGS. 1–3 the core is sheet-like, where appropriate for example to seal against a surface other than a flat surface such as along a ridge or groove, the core can have a different contour conforming to that of the gap between bodies 30, 32.

The sheet material 52 provides contact surfaces for bearing against bodies 30, 32 on opposite sides of gasket 20 to make electrical contact; however, electrical contact is also needed through the gasket, from one opposite side to the other. Sheet material 52 can extend around the edges of the core to make electrical contact (not shown), but according to an aspect of the invention electrical contact is alternatively or additionally made through the core at a plurality of spaced locations.

Resilient core 42 can be conductive or nonconductive but the compression characteristics of nonconductive materials are generally better and nonconductive materials are less expensive. Core 42 can be a rubber or a polymer, provided the core is sufficiently resilient to press the conductive covering material 52 into good electrical contact with the bodies 30, 32. Core 42 can be molded, extruded, cut from a block, cured in place, etc. Preferably core 42 comprises a polymer such as foamed polyurethane or the like. In a typical example, the core can be a polyurethane or polyethylene foam of a density of 2 lb./ft$^3$ (0.03 g/cm$^3$), having an indentation load deflection of 30 lb. (13.6 kg).

The electrically conductive material 52 can comprise various forms of woven or non-woven conductive material sufficiently flexible to conform to the contour of conductive bodies 30, 32. For example, metal foil, screen, wire mesh, braided, woven or knitted wire or metalized fibers, and the like, made from or incorporating metal sheet, fibers or particles, can provide a sufficiently flexible and electrically conductive surface. Preferably, covering material 52 comprises a fabric or thin batt incorporating metal fibers, metal alloy fibers or metallized synthetic fibers. Alternatively or in addition, a conductive coating can be provided in the form of a cured polymer incorporating a suspension of conductive particles, such as a colloidal suspension of conductive carbon particles, e.g., carbon black or specifically acetylene black. In a preferred embodiment, the covering material 52 comprises a woven or non-woven fabric of metallized nylon (polyamide) fibers. In a non-woven fabric, the fibers or filaments can be spunbonded or chemically bonded or heat bonded to maintain integrity, and either metallized by a plating technique or originally formed to include metal particles, fibers or filaments. The primary function of the surface material is to provide a conforming conductive surface for engaging electrically with bodies 30, 32.

In a woven fabric, Monsanto "Flectron" nickel/copper metallized polyester fabric or the like can be used as the conductive surface material 52. In a nonwoven material, a silver plated point bonded nylon batt can be used, preferably with a polymeric coating. A suitable material is AgPBNIIC3+, available from Schlegel Corporation, Rochester, N.Y. Of course other materials made from or incorporating conductive fibers, particles or platings can also be used.

In the embodiment of FIGS. 1–3, the conductive surface material on opposite sides of the gasket are electrically connected by sewn lines 62 of stitched conductive thread 65, passing through the sheet material 52 on opposite sides of the gasket and through core 42. The conductive thread can be a silver metallized nylon, preferably having multiple fibers (i.e., multifilament silver metallized yarn). In this embodiment the stitching is provided as spaced parallel stitch lines 62 in two series that cross over one another, thus quilting the gasket. Preferably, sheet material 52 is adhered to core 42, but it is also possible to rely only on the stitching for attaching sheets 52 to core 42.

Gasket 20 as shown is die cut to trim the edges to size and to provide any necessary clearance openings 33, in which event the stitching forms the exclusive electrical connection between the sheets 52 on opposite sides. In an uncompressed state as shown in FIG. 2, the conductive yarn or the like preferably is tensioned to compress foam core 42 slightly, for example to place the loops of the stitches at approximately the same elevation as the outside surfaces of sheets 52 at areas spaced from stitch lines 62. Thus the gasket remains substantially flat and the stitch lines do not tend to form deep depressions that prevent substantially continuous contact between sheets 52 and conductive bodies 30, 32.

In FIG. 3, gasket 20 is shown compressed between bodies 30, 32 at a clearance opening 33. The extent of compression needed depends on the particular application, and the gasket in FIG. 3 is compressed to about 55% of the width of the uncompressed gasket in FIG. 2. The resilience of core 42 and the flexibility of sheets 52 are such as to cause the gasket to conform closely to the surfaces of bodies 30, 32. With sufficient compression, the lengths of conductive yarn extending through core 42 are likewise compressed endwise.

Whereas the electrical path from one side of the gasket to the other would normally pass around edges of the gasket, for example where sheets 52 are lapped over the edges or using conductive tape to couple around the edges, according to the invention each of the stitches forms a connection from one side of the gasket to the other. These connections are dispersed throughout the length and width of the gasket and thus provide electrical connections that are nearer to most points on the surface of the gasket than an edge wrapping. The conductivity of the gasket as a whole results from the parallel connection of all of the conductive paths between any two points of contact on opposite sides. In a test, a one inch square (6.5 cm$^2$) of gasket AgPBNIIC3+ of thickness 0.04 in. (1 mm) on opposite sides of a polyurethane core, stitched along two edges with silver plated yarn, was found to have an electrical resistance equal to the resistance of the same size and material gasket wrapped around two opposite edges, namely about 0.04Ω-in. (0.1Ω-cm) at a compression of 0.73 Kg.

In FIGS. 1–3, a loop stitch is provided using conductive yarn, thread, wire or the like as a non-limiting example. As other examples, a running stitch alternately passing over and under the gasket can also be used, and/or a whip stitch or chain stitch along the edges. There are a variety of ways available to provide conductive connections through core 42. In FIG. 4, stitch lines 62 are provided in one direction only, running parallel to one another. As shown in enlarged detail in FIG. 5, the stitches need not be tensioned so as to form a depression, provided there is good electrical contact with sheets 52, normally achieved both at the points where the stitches pierce sheets 52 and along the surfaces of sheets 52 between stitch piercings.

FIGS. 6 and 7 similarly show an embodiment wherein conductive connections are made along seam lines 72 using the material of conductive sheets 52. Provided the material of core 42 is thermoplastic (e.g., polyethylene foam), a heated pinch roller or the like can depress one or both conductive sheets 52 and heat bond them through the core, making electrical connections by welding the sheet material from the opposite sides. This embodiment is appropriate where core 42 is thermoplastic and relatively thin. Seam lines 72 can cross one another, forming a series of discrete segments as shown, or can be run parallel or restricted to individual points dispersed on gasket 20.

As shown in FIG. 7, seam lines 72 have a certain width, at which gasket 20 in an uncompressed state would not contact the respective conductive body 30 or 32 continuously (e.g., as in FIG. 3). Advantageously, seam lines 72 are narrow compared to the thickness and intended compression of gasket 20, causing bulging of the compressed gasket substantially to close the gap across seam lines 72.

FIG. 8 shows an alternative embodiment in which point attachments 75 are made between sheets 52 to obtain conductive connection of the sheets. Point attachments can be made using point fasteners such as rivets or the like, but preferably are made by conductive thread, yarn, wire or other similar material. For example as in FIG. 9, a discrete loop of such material can be sewn through at each point attachment 75, compressing core 42 at that point. The loop can be knotted off or attached to a further button-like body (not shown), in the manner of an upholstery tuft.

Figure 11:
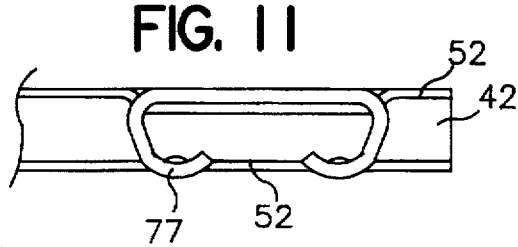
FIG. 11 is a partial section view through a staple, for example along line 11—11 in FIG. 10.

FIGS. 10 and 11 illustrate discrete conductive couplings formed by individual wire fasteners 77, i.e., staples piercing through both sheets 52. As above, the staples are preferably closed sufficiently that the wire of the staples resides at about the same elevation as the exterior surface of sheets 52.

Core 42 can be substantially integral or formed in segments that together make up gasket 20. In each case the conductive connections pierce the core to provide electrical connections through the gasket whereby an electrical connection can be made through the gasket. Any of the foregoing examples for making the electrical connection can be used exclusively or in combination with others of the examples or similar techniques. In addition, conductive connections of this type can be used in a gasket that also has the opposite sheets 52 connected to one another around the edges of the gasket, e.g., integrally or with conductive tape such as strips of the same type of material as sheets 52, attached via conductive adhesive or heat welding or the like.

However, the invention is particularly convenient when applied to a gasket that is die cut, thereby removing the sheet material at one or more edges, including the peripheral edges or the edges of any through holes. Such edge cuts and through holes would normally result in an increased length of the path through the conductive material from point to point on either side of sheets 52 as well as between points on the opposite sides of gasket 20 (assuming a conductive connection remained). The conductive connections of the invention supply the needed electrical connections, and in fact reduce the length of the conductive path and therefore the electrical resistance between the conductive bodies 30, 32. As a result, shielding efficiency is improved even as compared to a gasket that has conductive wrapping at the edges.

Figure 12:
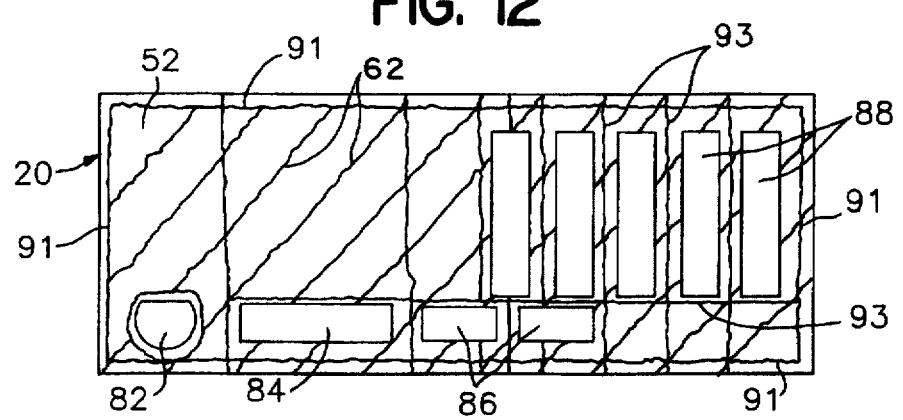

As shown in FIG. 12, the conductive connections can be placed to maximize the effect of the conductive connections in a die cut gasket having a plurality of through holes and no edge wrapping. The gasket as shown, for example, can be used for a backplane gasket in a personal computer having an EMI sealed power plug access opening 82, openings 84 for parallel communication connectors, openings 86 for serial port connectors and a plurality of openings 88 for the flanges (and potentially connectors) of circuit cards mounted in expansion slots (not shown). Instead of or in addition to a quilt-like pattern of conductive stitch lines 62, perimeter conductive stitch lines 91 and intermediate stitch lines 93 are disposed around the periphery of the gasket and between the various through openings, for increasing the conductive connections in areas where the cutouts are such that the local concentration of through connections is lower than in areas where no openings are provided.

According to each of the foregoing techniques, electromagnetic radiation is blocked between at least two electrically conductive bodies 30, 32 over a length and a width, by providing a compressible core 42 generally shaped as a sheet extending along at least part of the length and width, affixing an electrically conductive surface material 52 on opposite faces of core 42 for bearing against the conductive bodies, and forming a plurality of electrically conductive connections 62 (etc.) at spaced positions for electrically coupling between the electrically conductive surface on said opposite faces, thereby forming a gasket 20. When the gasket 20 is compressed between conductive bodies 30, 32, the electrical connections and the sheet material 52 engage and seal across any gap.

Figure 13:
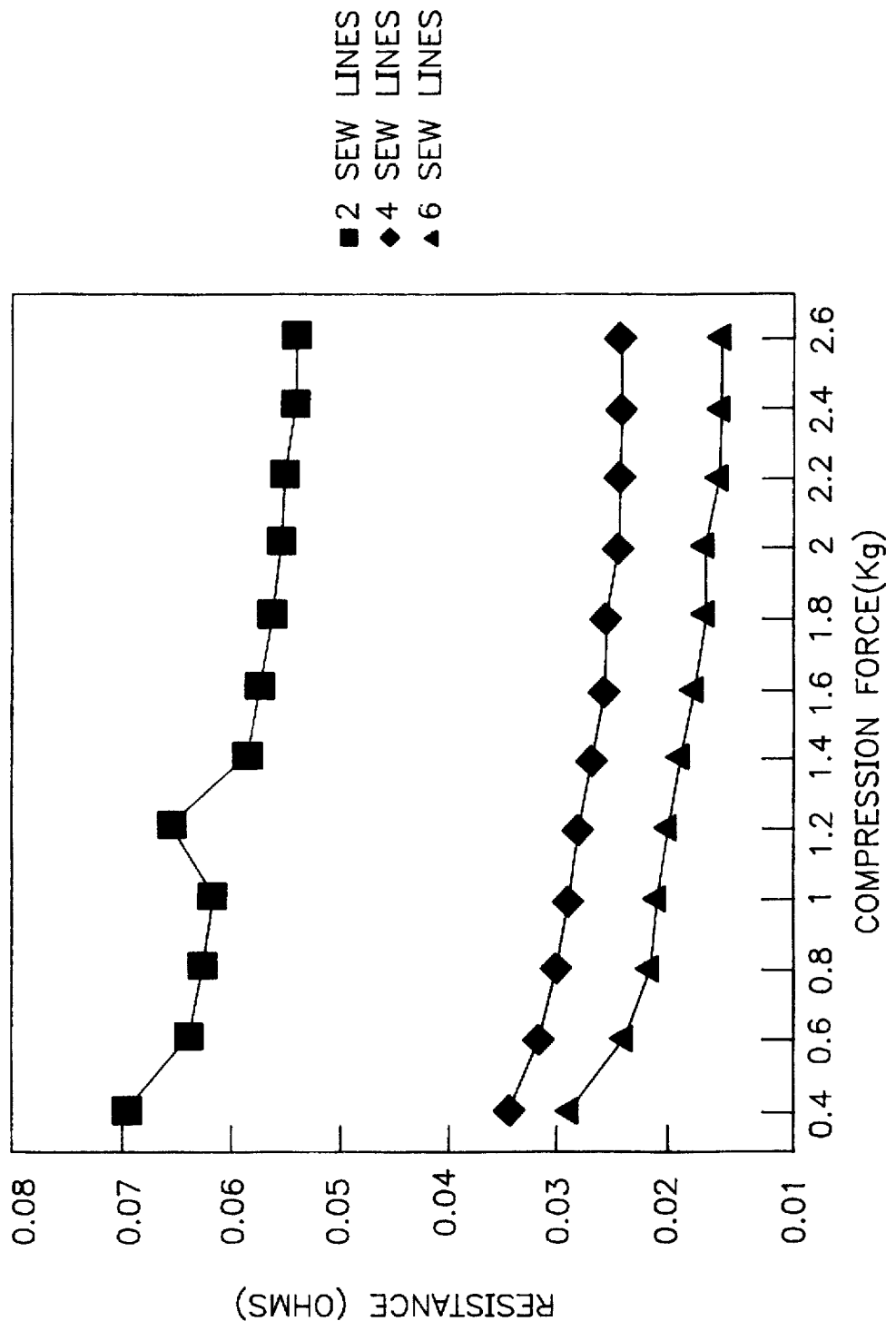
FIG. 13 is a graph of electrical resistance vs. compression, measured between sealed conductive bodies through the gasket of the invention, and showing the relationship of resistance to density of electrical attachments traversing the core.

Generally speaking, electrical coupling across the gap and sealing efficiency are increased with greater density of the electrical connections. FIG. 13 is a graph of resistance between bodies 30, 32 as a function of compression of an AgPBNIIC3+ surfaced gasket as discussed. In particular, a three by five inch (7.6×12.7 cm) gasket was sewn with conductive yarn along lines about one inch (2.5 cm) apart, the outermost being adjacent the perimeter (i.e., six lines 62), providing a resistance of about 0.016Ω at 2.6 Kg compression. With four lines 62 (i.e., upon removing two of the six), the resistance was about 0.027Ω, and with only two remaining the resistance was about 0.055Ω. These results show that shielding efficiency can be improved with stitch density, and the results suggest that by multiplying and dispersing the individual conductive paths between sheets 52 through core 42, an EMI gasket at least as effective as a fully wrapped gasket can be provided in the foregoing manner. Of course the shielding effectiveness of a wrapped gasket can also be thereby improved.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

We claim:

1. A gasket for blocking electromagnetic radiation between at least two electrically conductive bodies over an area having a length and a width, comprising:
   a compressible core generally shaped as a sheet extending along at least part of the length and width;
   an electrically conductive surface material disposed on opposite faces of the core for bearing against the conductive bodies; and,
   a plurality of electrically conductive connections at spaced positions, electrically coupling between the electrically conductive surface material on said opposite faces.

2. The gasket of claim 1, wherein the electrically conductive connections comprise portions of the surface material extending into the core.

3. The gasket of claim 2, wherein the surface material of the opposite faces is heat sealed for making the connections.

4. The gasket of claim 1, wherein the electrically conductive connections comprise conductive material extending between the surface material on the opposite faces.

5. The gasket of claim 1, wherein the conductive connections are made via at least one of conductive point fasteners and conductive stitching extending through the surface material on the opposite faces.

6. The gasket of claim 5, wherein the core is substantially integral and the conductive connections pierce the core.

7. The gasket of claim 6, wherein the conductive connections comprise at least one point connection sewn from at least one of wire strands, wire fibers, metalized conductive polymer thread and metalized conductive polymer yarn.

8. The gasket of claim 6, wherein the conductive connections comprise at least one seam sewn from at least one of wire strands, wire fibers, metalized conductive polymer thread and metalized conductive polymer yarn.

9. The gasket of claim 8, wherein the conductive connections comprise a plurality of seams.

10. The gasket of claim 9, wherein the gasket is quilted by nonoverlapping said seams.

11. The gasket of claim 10, wherein the gasket is quilted by overlapping said seams.

12. A gasket for electrically coupling between at least two electrically conductive bodies over an area having a length and a width, comprising:
   a compressible core generally shaped as a sheet extending along at least part of the length and width;
   a surface material disposed on opposite faces of the core for bearing against the conductive bodies; and,
   a plurality of electrically conductive connections at spaced positions, electrically coupling through the core and between the opposite faces, whereby a plurality of electrical connections are made between the conductive bodies at said spaced positions.

13. The gasket of claim 12, wherein the conductive connections are made via at least one of conductive point fasteners and conductive stitching extending through the surface material on the opposite faces.

14. The gasket of claim 13, wherein the conductive connections comprise at least one point connection sewn from at least one of wire strands, wire fibers, metalized conductive polymer thread and metalized conductive polymer yarn.

15. The gasket of claim 13, wherein the conductive connections comprise at least one seam sewn from at least one of wire strands, wire fibers, metalized conductive polymer thread and metalized conductive polymer yarn.

16. The gasket of claim 12, wherein the surface material is also conductive, whereby the surface material and the conductive connections electrically couple between the conductive bodies.

* * * * *